(12) United States Patent
Lin et al.

(10) Patent No.: US 11,594,485 B2
(45) Date of Patent: Feb. 28, 2023

(54) LOCAL INTERCONNECT WITH AIR GAP

(71) Applicant: INTEL CORPORATION, Santa Clara, CA (US)

(72) Inventors: Kevin L. Lin, Beaverton, OR (US); Scott B. Clendenning, Portland, OR (US); Tristan A. Tronic, Aloha, OR (US); Urusa Alaan, Hillsboro, OR (US); Ehren Mannebach, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 742 days.

(21) Appl. No.: 16/430,977

(22) Filed: Jun. 4, 2019

(65) Prior Publication Data

US 2020/0388565 A1 Dec. 10, 2020

(51) Int. Cl.
| | | |
|---|---|---|
| *H01L 23/528* | (2006.01) | |
| *H01L 23/532* | (2006.01) | |
| *H01L 23/522* | (2006.01) | |
| *H01L 21/768* | (2006.01) | |
| *H01L 21/311* | (2006.01) | |
| *H01L 21/3105* | (2006.01) | |

(52) U.S. Cl.
CPC ...... *H01L 23/528* (2013.01); *H01L 21/31053* (2013.01); *H01L 21/31144* (2013.01); *H01L 21/7682* (2013.01); *H01L 21/76802* (2013.01); *H01L 21/76819* (2013.01); *H01L 21/76877* (2013.01); *H01L 23/5226* (2013.01); *H01L 23/53295* (2013.01)

(58) Field of Classification Search
CPC ............... H01L 23/528; H01L 23/5226; H01L 23/53295
See application file for complete search history.

(56) References Cited

U.S. PATENT DOCUMENTS

| | | |
|---|---|---|
| 5,241,456 A | 8/1993 | Marcinkiewicz et al. |
| 6,368,948 B1 | 4/2002 | Ngo et al. |
| 9,583,442 B2 | 2/2017 | Fan et al. |
| 9,728,551 B1 * | 8/2017 | Lu .................. H01L 23/5226 |
| 9,911,652 B1 * | 3/2018 | Clevenger ......... H01L 21/76816 |
| 10,236,364 B1 * | 3/2019 | Cheng ............... H01L 29/66977 |
| 10,763,160 B1 * | 9/2020 | Penny ................ H01L 21/7682 |

(Continued)

OTHER PUBLICATIONS

Houman Zahedmanesh et al., "Airgaps In Nano-Interconnects: Mechanics and Impact on Electromigration", Journal of Applied Physics, 2016, 120, Abstract Only.

*Primary Examiner* — Nathan W Ha
(74) *Attorney, Agent, or Firm* — Schwabe, Williamson & Wyatt, P.C.

(57) ABSTRACT

An integrated circuit includes a base comprising an insulating dielectric. A plurality of conductive lines extends vertically above the base in a spaced-apart arrangement, the plurality including a first conductive line and a second conductive line adjacent to the first conductive line. A void is between the first and second conductive lines. A cap of insulating material is located above the void and defines an upper boundary of the void such that the void is further located between the base and the cap of insulating material. In some embodiments, one or more vias contacts an upper end of one or more of the conductive lines.

20 Claims, 12 Drawing Sheets

(56) References Cited

U.S. PATENT DOCUMENTS

| | | | |
|---|---|---|---|
| 2016/0133508 A1* | 5/2016 | Gates | H01L 21/31111 438/654 |
| 2016/0247722 A1* | 8/2016 | Zhang | H01L 21/7681 |
| 2016/0260733 A1* | 9/2016 | Lue | H01L 27/11565 |
| 2017/0221813 A1* | 8/2017 | Kim | H01L 27/11582 |
| 2018/0090587 A1 | 3/2018 | Bonilla et al. | |
| 2018/0144926 A1* | 5/2018 | Zhang | H01L 23/5329 |
| 2018/0218982 A1* | 8/2018 | Morita | H01L 21/764 |
| 2019/0006305 A1* | 1/2019 | Huang | H01L 21/486 |
| 2019/0006383 A1* | 1/2019 | Matsuno | H01L 21/76816 |
| 2019/0088739 A1* | 3/2019 | Lee | H01L 23/528 |
| 2019/0139885 A1* | 5/2019 | Lai | H01L 23/5226 |
| 2019/0172748 A1* | 6/2019 | Clevenger | H01L 21/7682 |
| 2019/0206718 A1* | 7/2019 | LiCausi | H01L 21/31058 |
| 2019/0311907 A1* | 10/2019 | Lai | H01L 27/11573 |
| 2019/0312050 A1* | 10/2019 | Lai | H01L 27/11582 |
| 2019/0312051 A1* | 10/2019 | Park | H01L 23/5226 |
| 2019/0378909 A1* | 12/2019 | Cheng | H01L 29/6656 |
| 2020/0098626 A1* | 3/2020 | Chowdhury | H01L 23/53209 |
| 2020/0328155 A1* | 10/2020 | Schultz | H01L 23/5222 |

\* cited by examiner

 
FIG. 8E  FIG. 8F
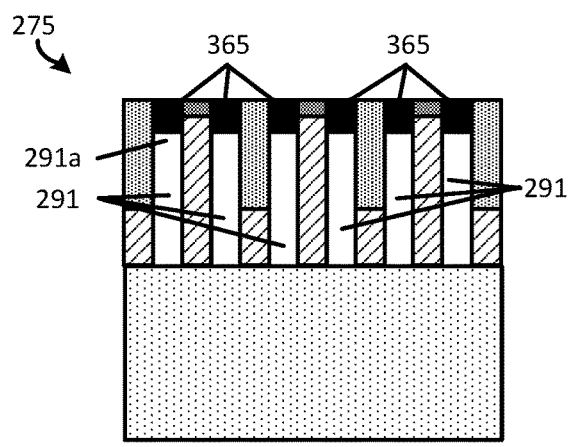 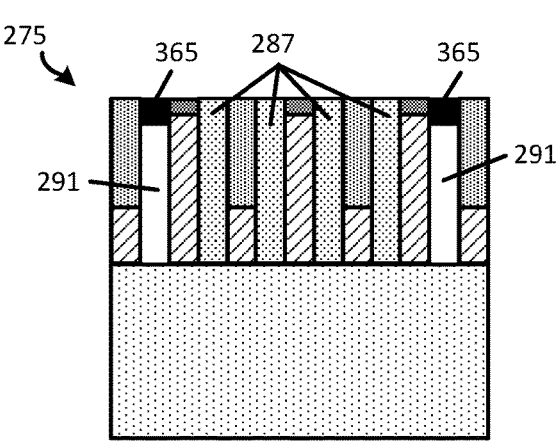
 
FIG. 8G  FIG. 8H
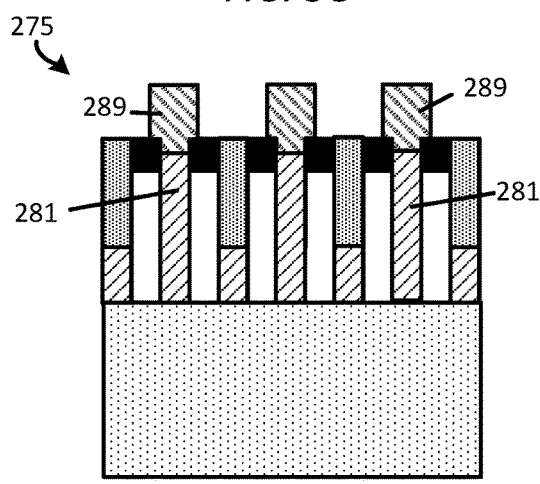 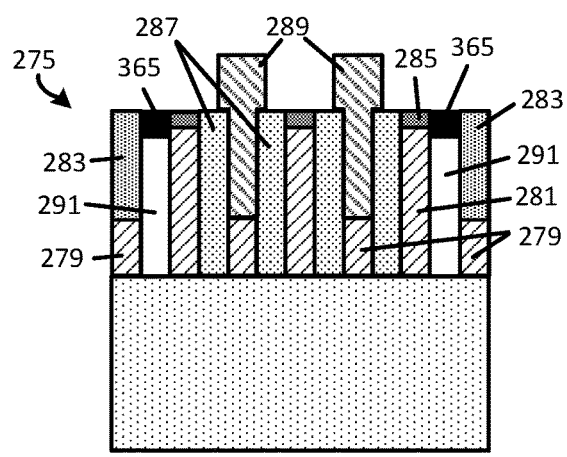

US 11,594,485 B2

LOCAL INTERCONNECT WITH AIR GAP

BACKGROUND

An integrated circuit typically includes a variety of electronic components or devices that exploit the electronic properties of semiconductor materials, such as silicon (Si), germanium (Ge), gallium arsenide (GaAs), and indium phosphide (InP). An integrated circuit may include transistors, capacitors, diodes, and other devices. One example of a transistor is a field-effect transistor (FET), which includes three terminals: a gate, a source, and a drain. A FET uses an electric field applied by the gate to control the electrical conductivity of a channel through which charge carriers (e.g., electrons or holes) flow between the source and drain. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits. FETs may be used in memory structures, power applications, and logic circuits, to name a few examples.

The source, drain, and gate structure of a FET are example locations where electrical connections are made in some integrated circuits. These structures are generally located at the device level of the IC and are processed during the first stage of IC processing, also referred to as front-end-of-line (FEOL) processing. These and other structures may be electrically connected, for example, to a voltage supply, to another device, or to a signal bus in a metallization layer, which are mostly located in a different level of the integrated circuit. For example, an integrated circuit may include several metallization layers located vertically above the device level and that are fabricated as part of the second portion of IC fabrication, or the back-end-of-line (BEOL) processing. An interconnect structure is one way to make electrical connections between structures in different levels of an integrated circuit and may include conductive materials that extend horizontally within a metallization layer. Various metallization layers can be connected together and/or to devices with conductive vias that extend vertically through and between various metallization layers of the integrated circuit.

BRIEF DESCRIPTION OF THE DRAWINGS

FIGS. 8A-8H illustrate cross-sectional views of interconnect structures at various stages of processing according the method of FIG. 7, in accordance with some embodiments of the present disclosure.

Figure 1:
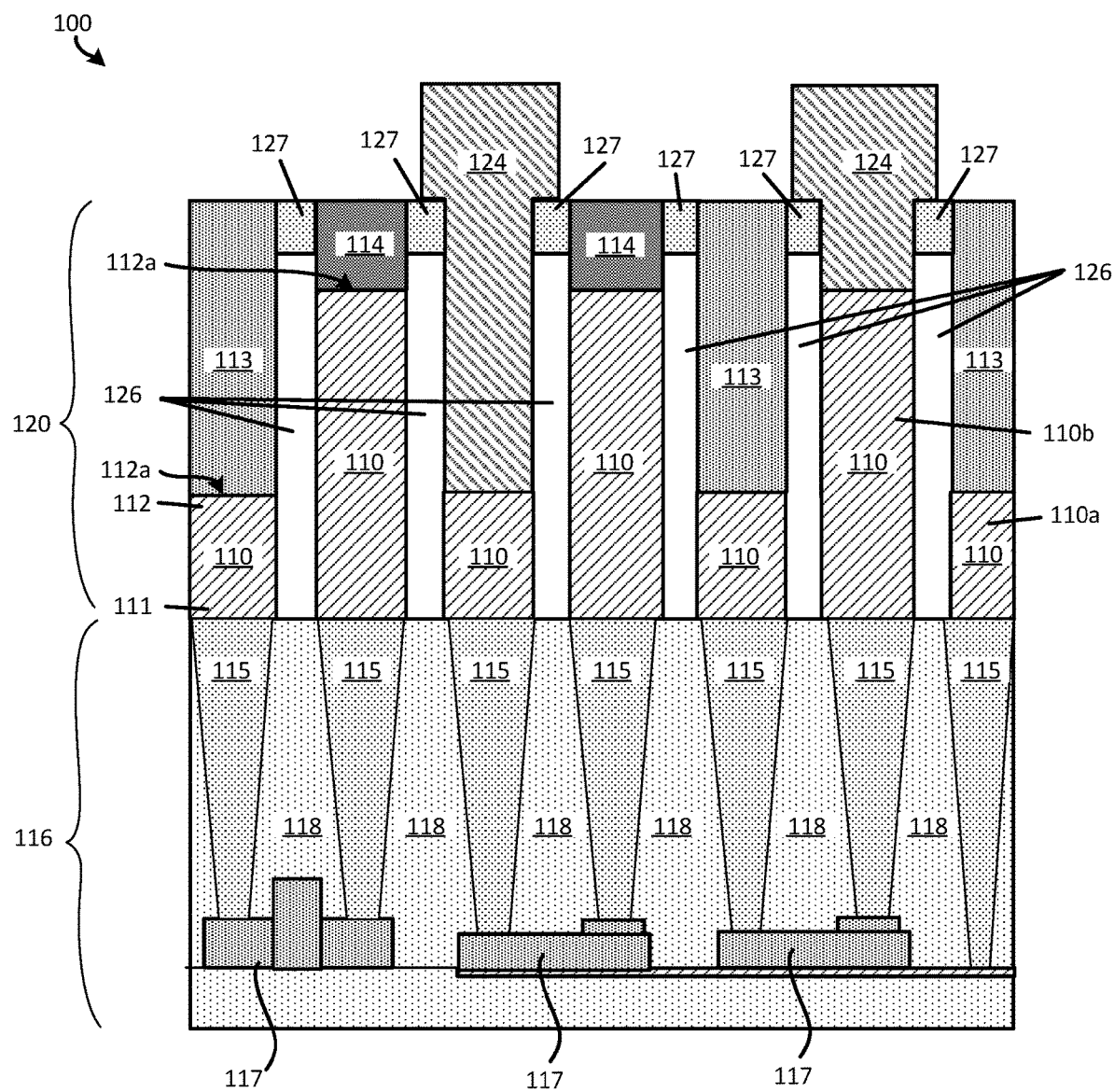
FIG. 1 illustrates a cross-sectional view of an interconnect structure in a first metallization layer of an integrated circuit, where voids are located between adjacent conductive lines, in accordance with an embodiment of the present disclosure.

These and other features of the present embodiments will be understood better by reading the following detailed description, taken together with the figures herein described. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for fabricating interconnect structures that include an airgap between adjacent conductive lines. In one example embodiment, the interconnect structure can be found in the first interconnect level above devices of an integrated circuit, where conductive lines are electrically coupled to structures at the device level. The device level may include devices on a substrate, whether in direct contact with the substrate or spaced from the substrate by one or more intervening layers of material. The interconnect structure includes a void or gas cavity between at least some of the adjacent conductive lines.

In one example embodiment, a base comprises an insulating dielectric. For example, the base could be a device layer or a metallization layer below the interconnect structure. A plurality of conductive lines extending vertically up from the base in a generally parallel and spaced-apart arrangement, where at least some adjacent lines of the plurality of conductive lines define a void or airgap therebetween. Each void is closed by insulating material located above and defining an upper boundary of the void. Accordingly, each void is located vertically between the base and the cap of insulating material and located horizontally between the adjacent lines. One or more vias extend down to contact an upper end of one or more of the conductive lines. Where the lines are not connected to vias, the conductive lines are topped with an insulator material extending up from the conductive line to the upper boundary of the metallization layer. This insulator material on top of the conductive lines can extend to, and in some cases overlaps, the cap of insulating material closing the void.

In some embodiments, the interconnect structure includes first conductive lines of a first metal and second conductive lines of a second metal. In some such embodiments, the first conductive lines are topped with a first insulator and the second conductive lines are topped with a second insulator different from the first insulator, such as to enable selective etch processing. In some embodiments, masking can be employed to selectively define voids between particular pairs of adjacent conductive lines. Methodologies disclosed herein generally apply to interconnect structures for integrated circuits and can be utilized regardless of the semiconductor material(s) and devices in the integrated circuit. However, the methodologies are particularly well-suited for use with logic structures. Disclosed methodologies are particularly useful with an interconnect stack with conductive lines having a tight pitch, such as a pitch of about 30 nm or less, about 20 nm or less, or about 15 nm. Numerous variations and embodiments will be apparent in light of the present disclosure.

General Overview

Integrated circuits (ICs) include electrical connections to devices and related components of the integrated circuit. Many of the electrical connections are made using interconnect structures in various metallization layers above the device layer of the IC. Conductive vias can be formed vertically between and/or through various metallization layers to enable control over or use of corresponding portions of the IC. For example, contact pads on the surface of the integrated circuit may be connected to millions of transistors at the device level by way of electrical pathways through various levels of the interconnect structure.

At the upper levels of interconnect, conductive lines are generally spaced farther apart than conductive lines in lower metallization layers. In the first metallization layer above the device layer, conductive lines may be tightly spaced, such as having a pitch of about 30 nm or less. As semiconductor devices are further scaled, conductive lines to the devices also become more tightly spaced. The close spacing of conductive elements can result in higher capacitance that negatively affects performance of the IC. Even when using low-k materials to isolate the conductive lines, the capacitance may still be higher than desired. Accordingly, a need exists for methodologies and structures to reduce capacitance in interconnect structures. The present disclosure addresses this need and others by providing an interconnect structure with voids (e.g., gas or air pockets) between adjacent conductive lines.

Note that materials described as being "compositionally different" or "compositionally distinct" as used herein refers to two materials that have different chemical compositions. This compositional difference may be, for instance, by virtue of an element that is in one material but not the other (e.g., $SiO_2$ is compositionally different from $Si_3N_4$), or by way of one material having all the same elements as a second material but at least one of those elements is intentionally provided at a different concentration in one material relative to the other material (e.g., SiGe having 70 atomic percent germanium is compositionally different from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon.

As also used herein, the term "low-κ" refers to a material having a dielectric constant equal to or less than that of silicon dioxide ($SiO_2$), which has a value of 3.9 according to some measurement methods. Examples of low-κ materials include amorphous carbon, spin-on glass, silicon oxycarbides (SiOCH), fluorine-doped $SiO_2$, carbon-doped $SiO_2$, and silsesquioxanes, to provide a few examples. As also used herein, the term "high-κ" refers to materials having a dielectric constant greater than that of silicon dioxide ($SiO_2$). Examples of high-κ dielectric materials include hafnium dioxide ($HfO_2$), zirconium dioxide ($ZrO_2$) and titanium dioxide ($TiO_2$) to provide some examples.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, TEM can be useful to show a cross section of an integrated circuit or die that includes an interconnect structure with voids or gas pockets between at least some adjacent conductive lines, rather than a solid material.

Architecture

FIG. 1 illustrates a cross-sectional view of an interconnect structure 100 in a first metallization layer 120 of an integrated circuit (IC), in accordance with one embodiment. The interconnect structure 100 includes a plurality of conductive lines 110 each of which extends vertically in the first metallization layer 120. In this example, the conductive lines 110 include first conductive lines 110a of a first metal and second conductive lines 110b of a second metal different from the first metal. In other embodiments, the interconnect structure 100 may have conductive lines 110 of only one metal. Also, the first conductive lines 110 are illustrated as having a shorter vertical height and the second conductive lines are illustrated as having a greater vertical height, but this is not required. In some embodiments, conductive lines 110 of one metal can have the same or different vertical height as conductive lines 110 of another metal. Conductive lines 110 of a given metal can have the same or different vertical height. Numerous variations and embodiments will be apparent in light of the present disclosure.

Each conductive line 110 extends vertically between a lower end 111 and an upper end 112. Each conductive line 110 extends at least partially through the first metallization layer 120 to an insulator or conductor (e.g., a via 124) in contact with its top surface 112a. Where not in contact with a via 124, first conductive lines 110a extend to a first insulator 113 on their top surfaces 112a and second conductive lines 110b extend to a second insulator 114 on their top surfaces 112a, where the second insulator 114. Note that the first insulator 113 and second insulator 114 may comprise a plurality of layers that may or may not exhibit a detectable boundary. In some embodiments, the first insulator 113 and second insulator 114 are compositionally distinct to enable selective etch processing, such as discussed in more detail below. In this example, one of the first conductive lines 110a and one of the second conductive lines 110b extends to and contacts a conductive via 124. In instances where the conductive line 110 does not extend completely through the first metallization layer 120, the insulator or conductor on the top surface 112a of the conductive line 110 continues vertically from the top surface 112a of the conductive line and to the upper boundary of the first metallization layer 120 along the path of the conductive line 110 below it.

Adjacent conductive lines 110 (including an insulator or via on its top surface) are spaced from one another. In this example embodiment, adjacent conductive lines 110 define a void 126 therebetween. The void 126 may be a vacuum pocket or enclosed pocket of air or other gas. The void 126 is closed at its upper end by an insulating dielectric 127 that extends laterally between the respective insulator or via on top of each conductive line 110, for example. Here, the void 126 between adjacent conductive lines 110 extends vertically and is bound at its bottom by a base or layer 116 below it (e.g., a device layer with ILD 118 and/or contacts 115), is bound at its top by an insulating dielectric 127. The void 126 is bound on its sides by conductive lines 110 and their respective insulator 113, 114.

In accordance with some embodiments, one or more of the conductive lines 110 are electrically coupled at a lower end 111 with a contact 115 of an IC device 117, a semiconductor, or a conductive structure in the layer 116 below. Contacts 115 in the device layer 116 are isolated from one another by ILD 118 that fills the space on top of and between device structures 117, as will be appreciated. As shown in this example embodiment, conductive lines 110 are in a first metallization layer 120 and the layer 116 below the first metallization layer 120 is the device layer. In such cases, the device layer 116 may include any number of features typical of a device layer, such as transistors that include source and drain regions, and gate structures. In one such example, contacts 115 can be, for example, source region and drain region contacts, or a gate contact. The transistors may be any type of transistors, whether having planar transistor architecture or non-planar architecture such as fin-based transistors and nanowire transistors. Note that the principles of the present disclosure can be applied to interconnect structures 100 in any metallization layer, whether the local interconnect proximate the device layer, or an upper metallization layer above the local interconnect layer.

Figure 2:
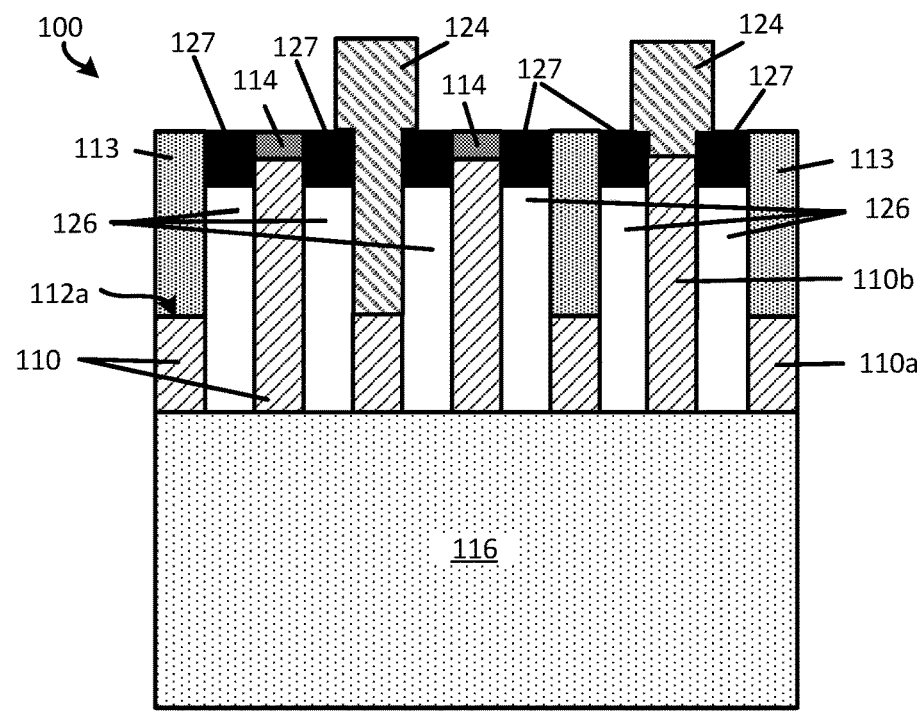
FIG. 2 illustrates a cross-sectional view of an interconnect structure with voids between adjacent conductive lines of different materials where the voids are closed at their upper ends with a dielectric film, in accordance with an embodiment of the present disclosure.

Referring now to FIG. 2, a cross-sectional view illustrates an interconnect structure 100 of an integrated circuit (IC), in accordance with another embodiment of the present disclosure. In this example, the interconnect structure 100 includes a plurality of first conductive lines 110a of a first metal and a plurality of second conductive lines 110b of a second metal. The first conductive lines 110a and the second conductive lines 110b extend vertically and have an alternating, spaced-apart arrangement. Except where a conductive line 110 contacts a via 124, the top surface 112a of the first conductive lines 110a contacts a first insulator 113 and the top surface 112a of the second conductive lines 110b contacts a second insulator 114. The first insulator 113 and the second insulator 114 extend vertically from and generally along the path defined by the conductive line below it. Adjacent conductive lines 110 are spaced by a void 126 that extends vertically between adjacent conductive lines 110. As noted above, the void 126 can be a vacuum or gas pocket. In this example, each void 126 is closed at the top by an insulating dielectric 127, such as a metal oxide or carbon-doped oxide. In some embodiments, the via 124 contacts a conductive line 110 only when the conductive line 110 has a vertical height at least as high as the bottom of the insulating dielectric 127. In some such embodiments, the voids 126 adjacent the via 124 may remain closed during via processing due to the presence of the insulating dielectric 127, for example. In other embodiments, such as shown here, vias 124 can make contact with a conductive line 110 that is at least as high the bottom of the insulating dielectric, and with a conductive line that has a top surface 112a that is below the bottom of the insulating dielectric 127.

As with embodiments discussed above, the first conductive lines 110a are illustrated as having a shorter vertical height and the second conductive lines 110b are illustrated as having a greater vertical height, but this is not required. In some embodiments, conductive lines 110 of one metal can have the same or different vertical height as conductive lines 110 of another metal. Conductive lines 110 of a given metal can have the same or different vertical height. Additionally, while this example includes first and second conductive lines 110a, 110b, the interconnect structure 100 is not required to have more than one type of conductive line 110. Numerous variations and embodiments will be apparent in light of the present disclosure.

Figure 3:
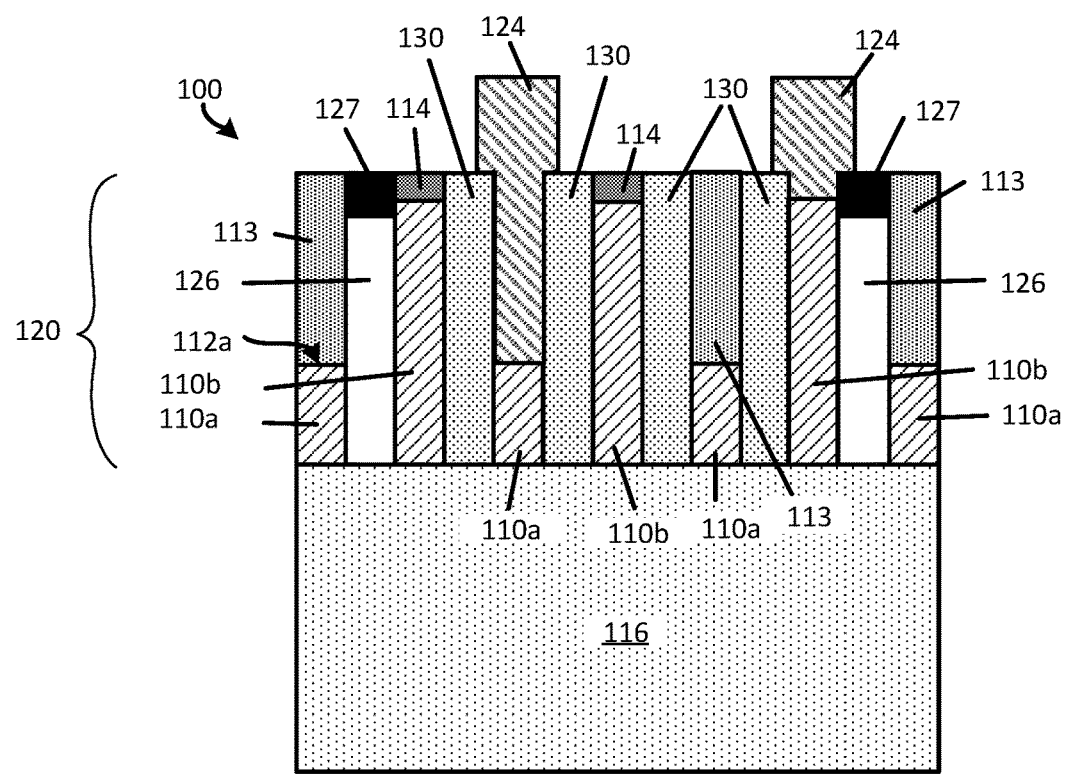
FIG. 3 illustrates a cross-sectional view of an interconnect structure with voids between some adjacent conductive lines and spacer material between other adjacent conductive lines, in accordance with an embodiment of the present disclosure.

Referring now to FIG. 3, a cross-sectional view illustrates an interconnect structure 100 of an integrated circuit (IC), in accordance with another embodiment of the present disclosure. In this example, the interconnect structure 100 includes a plurality of first conductive lines 110a of a first metal and a plurality of second conductive lines 110b of a second metal, where the conductive lines 110 extend vertically and have an alternating, spaced-apart arrangement. Except where a conductive line 110 contacts a via 124, the top surface 112a of the first conductive lines 110a contacts a first insulator 113 and the top surface 112a of the second conductive lines 110b contacts a second insulator 114. The first insulator 113 and the second insulator 114 extend vertically up from and generally along the path defined by the conductive line 110 below it. In this example, some but not all adjacent conductive lines 110 are spaced by a void 126. Each void 126 is closed at the top by an insulating dielectric 127, such as a metal oxide or carbon-doped oxide. Between other adjacent conductive lines (and their respective insulator or via) is a spacer material 130, such as silicon cyanate (referred to as $Si(OCN)_4$ or more generally as SiOCN). Each via 124 extends along spacer material 130 on one or both its sides. In some embodiments, vias 124 are flanked on both sides by spacer material. As can be seen in this example, the spacer material 130 extends the entire vertical height of the metallization layer 120, whereas the conductive lines 110 extend less than the full vertical height of the metallization layer 120. Top surfaces of the first insulator 113, second insulator 114, insulating dielectric 127, and spacer material 130 are coplanar and define the upper boundary of the metallization layer 120. Portions of the vias 124 extend above the metallization layer 120.

Figure 4:
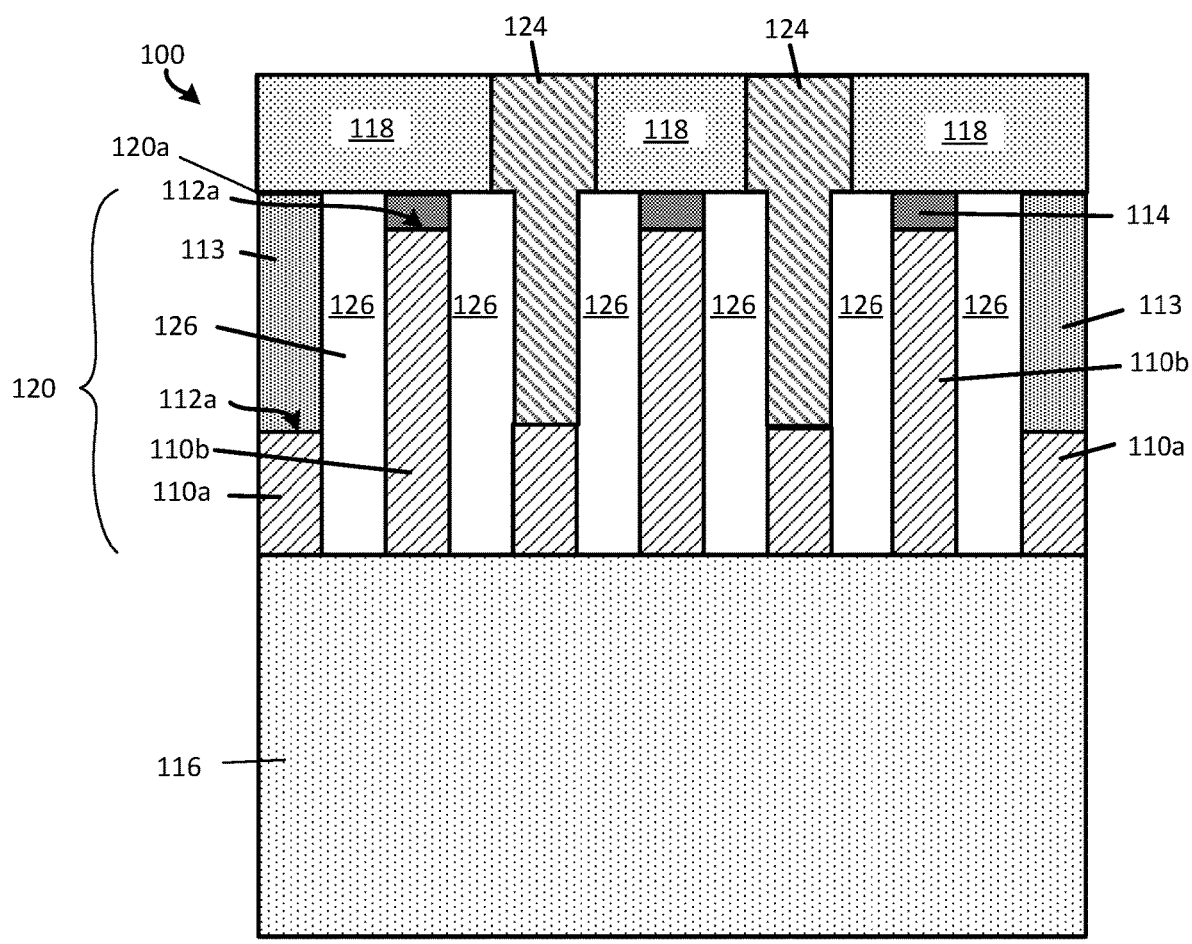
FIG. 4 illustrates a cross-sectional view of an interconnect structure with voids between adjacent conductive lines, where the voids are closed at their upper ends by a layer of interlayer dielectric material, in accordance with an embodiment of the present disclosure.

Referring now to FIG. 4, a cross-sectional view illustrates an interconnect structure 100 for an integrated circuit (IC), in accordance with another embodiment of the present disclosure. In this example, the interconnect structure 100 includes a plurality of first conductive lines 110a of a first metal and a plurality of second conductive lines 110b of a second metal. The conductive lines 110 extend vertically from a base (e.g., layer 116) in an alternating, spaced-apart arrangement. Except where a conductive line 110 contacts a via 124, the top surface 112a of the first conductive lines 110a contacts a first insulator 113 and the top surface 112a of the second conductive lines 110b contacts a second insulator 114. The first insulator 113 and the second insulator 114 extend vertically up from and generally along the path defined by the conductive line below it. Top surfaces of the first insulator 113 and the second insulator 114 are coplanar and define the upper boundary 120a of the metallization layer 120. Adjacent conductive lines 110 are separated by a void 126 that extends vertically between the adjacent conductive lines 110. In this example, each void 126 is closed at the top by a layer of interlayer dielectric 118 on top of the metallization layer 120 and in contact with the first and second insulators 113, 114. The interlayer dielectric 118 fills space between portions of the vias 124 that extend above the metallization layer 120. As shown in this example, a void 126 is between every pair of adjacent conductive lines 110, but this is not required. In other example embodiments, a spacer material is between some adjacent conductive lines, such as shown in FIG. 3. Numerous variations and embodiments will be apparent in light of the present disclosure.

Fabrication Methodologies

Figure 5:
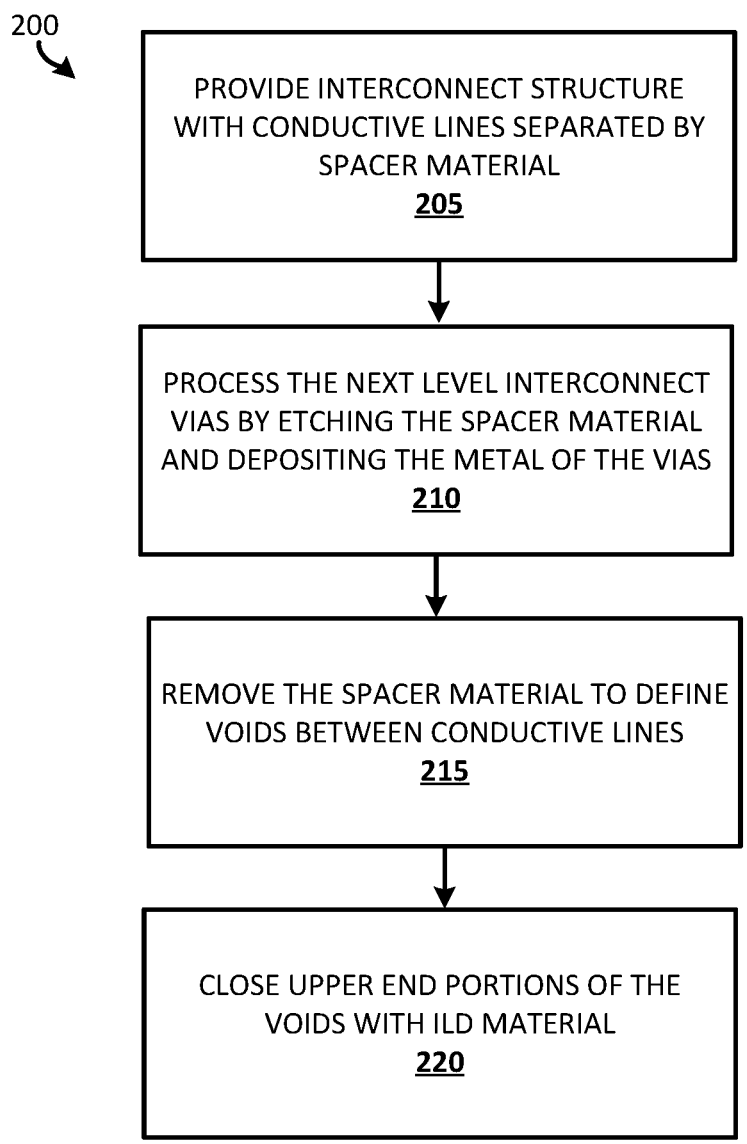
FIG. 5 illustrates a process flow for a method of fabricating an interconnect structure, in accordance with an embodiment of the present disclosure.
Figure 6A:
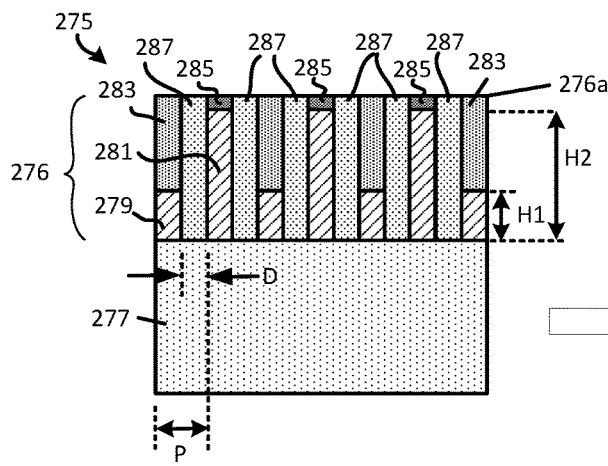
FIGS. 6A-6D illustrate cross-sectional views of interconnect structures at various stages of processing according to the method of FIG. 5, in accordance with some embodiments of the present disclosure.
Figure 6B:
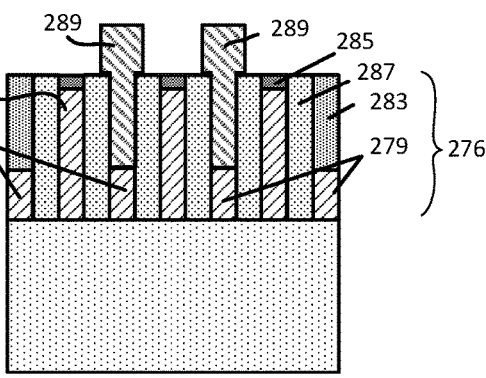
Figure 6C:
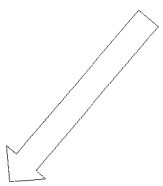
Figure 6D:
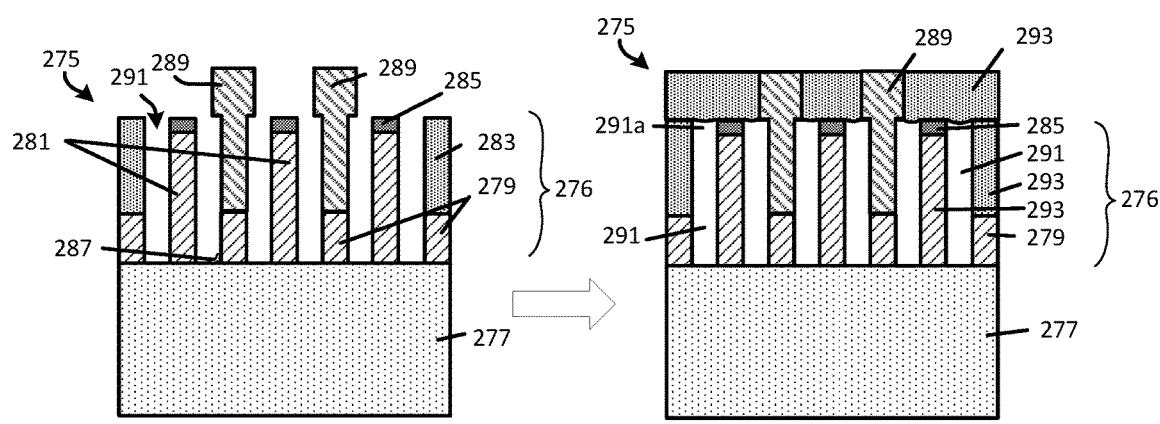
Figure 7:
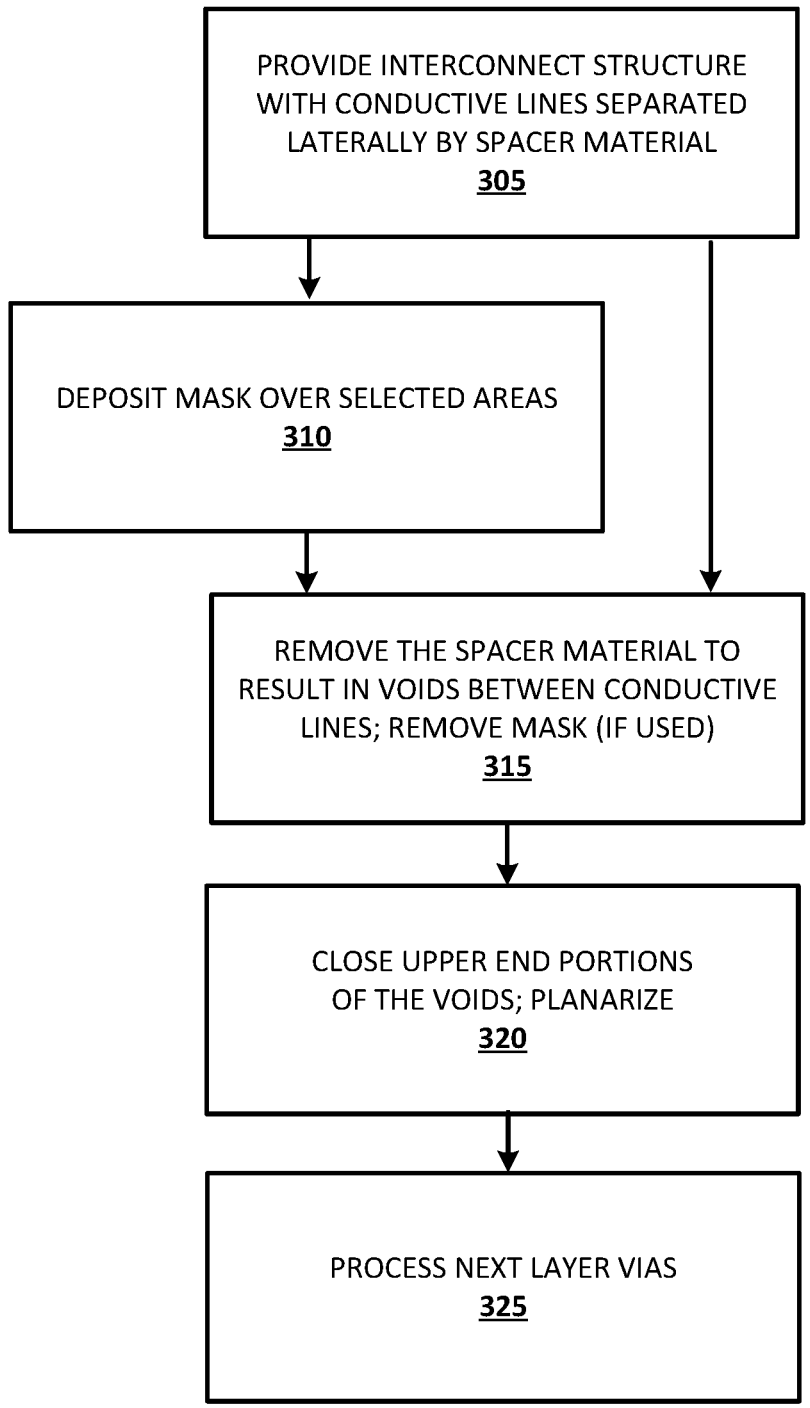
FIG. 7 illustrates a process flow for a method of fabricating an interconnect structure, in accordance with another embodiment of the present disclosure.
Figure 8A:
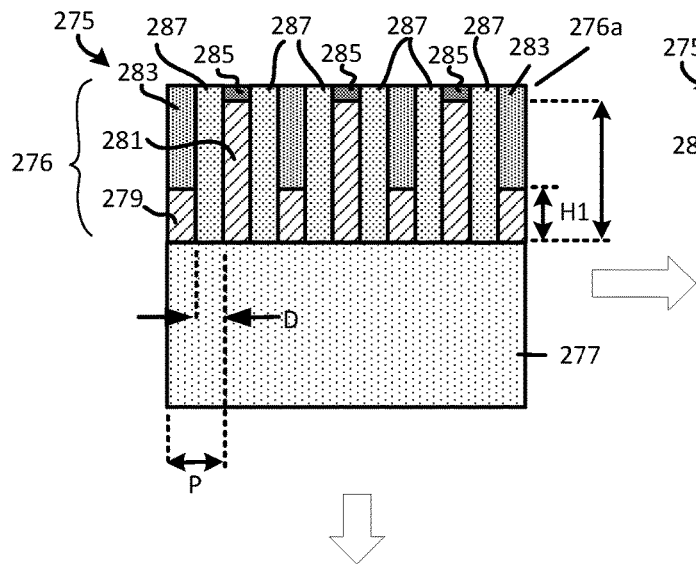
Figure 8B:
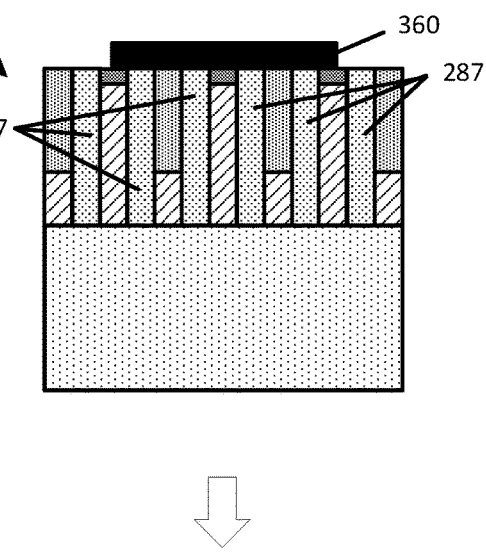
Figure 8C:
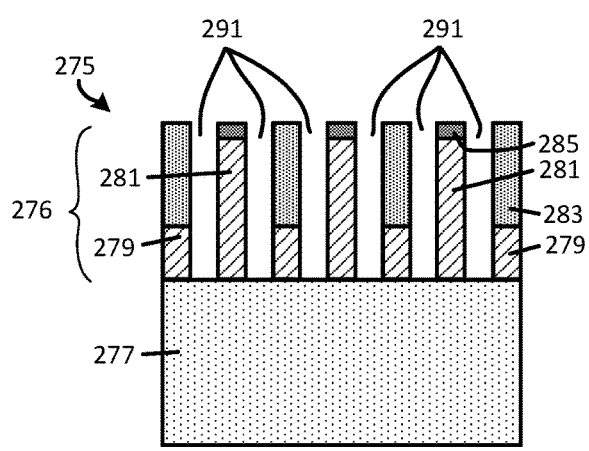
Figure 8D:
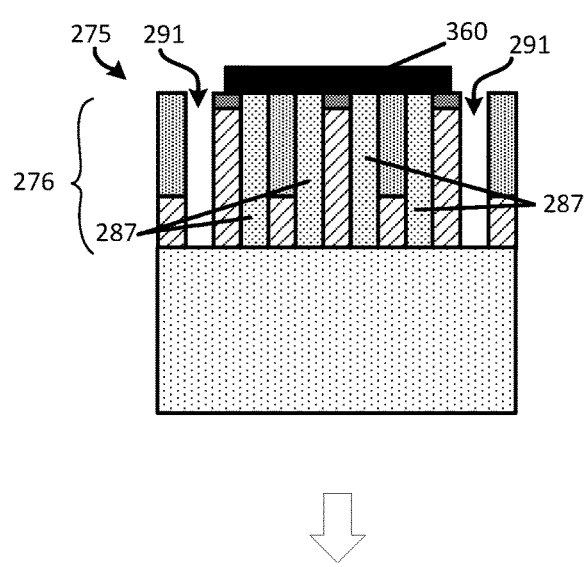
Figure 9:
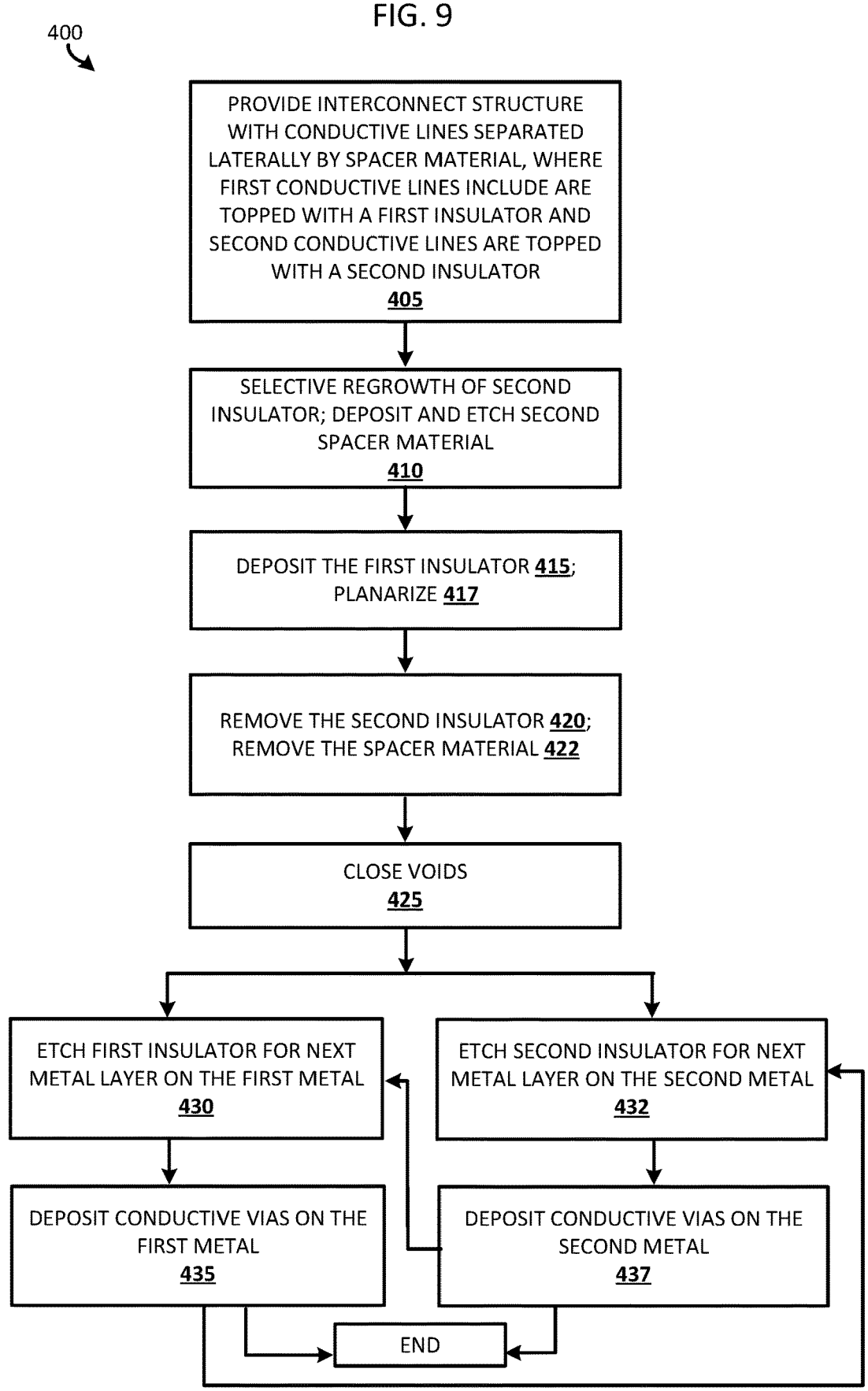
FIG. 9 illustrates a process flow for a method of fabricating an interconnect structure, in accordance with another embodiment of the present disclosure.

Referring now to FIGS. 5, 7, and 9, flow charts illustrate process flows in methods 200, 300, 400 of fabricating an interconnect structure for an integrated circuit, in accordance with some embodiments. Along with the discussion of each process flow, example structures at various stages of processing will be discussed with reference to FIGS. 6, 8, and 10. Methods 200, 300, 400 are discussed in the context of an interconnect structure located in the first metallization layer above front-end-of-line devices in a device level of an integrated circuit, for example. However, methods 200, 300, 400 are not restricted to fabrication in the first metallization layer and interconnect structures of the present disclosure similarly can be fabricated in the second, third, fourth, or other metallization layer of an integrated circuit. In one example, conductive lines in the interconnect structure are electrically coupled to semiconductor devices located in a device level of the IC. In some instances, the semiconductor devices directly contact or are fabricated to include the substrate material, such as a bulk silicon wafer or other suitable substrate. In other instances, semiconductor devices are fabricated from or include a semiconductor material deposited on or over the substrate, where the semiconductor material directly contacts the substrate or is separated from the substrate by one or more intervening layers of insulating, conducting, or semiconducting material.

In general, methods 200, 300, 400 can be performed using any suitable semiconductor fabrication techniques, including deposition, photolithography, wet or dry chemical etching processes (e.g., atomic layer etch, plasma etch, wet etch), chemical mechanical polishing, deposition or epitaxial growth processes (e.g., CVD, PVD, ALD, VPE, MBE, LPE), melt regrowth, and/or any other suitable processing, as will be appreciated. Methods 200, 300 may include fewer processes and therefore may be considered to be simpler than method 400, which generally includes additional processes. Method 400, however, may be advantageous in some situations by providing increased control over removal of the spacer material, in accordance with some embodiments.

Method 200 of FIG. 5 begins with providing 205 a local interconnect stack with a plurality of conductive lines extending vertically from a base, where the conductive lines are spaced by spacer material between the conductive lines. For example, the base is the layer below the metallization layer of the interconnect stack, such as a device layer or other interconnect layer. The conductive lines can have a pitch P of 40 nm or less, including 30 nm or less, 25 nm or less, 20 nm or less, 15 nm or less, and 10 nm or less. Similarly, the lateral distance D between adjacent conductive lines can be 30 nm or less, including 20 nm or less, 15 nm or less, 10 nm or less, and 5 nm or less, in accordance with some embodiments. On top of each conductive line is an insulator material (e.g., a "cap"), where the cap of insulator material fills any unfilled vertical distance above the top surface of the conductive line and the upper boundary of the metallization layer. In some embodiments, the conductive lines include one or more conductive lines of a first metal and one or more conductive lines of a second metal. The first metal can be capped with a first insulator material that is different from the spacer material. The second metal can be capped with a second insulator material that is different from the first insulator material and different from the spacer material. In some such embodiments, the conductive lines may have an alternating or semi-alternating arrangement (e.g., first-second-first-second or first-first-second-second-first-first-second-second, etc). Conductive lines of the first metal can have the same or a different vertical height compared to conductive lines of the second metal. Also, conductive lines of a given metal can have the same or different vertical height. Examples of some acceptable metals for conductive lines and/or vias include aluminum, silver, gold, copper, tungsten, cobalt, ruthenium, and alloys thereof. Numerous variations and embodiments will be apparent in light of the present disclosure.

FIG. 6A illustrates a cross-sectional view of an example local interconnect stack 275 in a metallization layer 276 on a device layer 277 of an integrated circuit. The local interconnect stack 275 includes first conductive lines 279 of a first metal and first vertical height H1 and second conductive lines 281 of a second metal and second vertical height H2. The first conductive lines 279 are capped with a first insulator 283 that extends vertically up to the upper boundary 276a of the metallization layer 276. Second conductive lines 281 are capped with a second insulator 285 that extends vertically up to the upper boundary 276a of the metallization layer 276. A spacer material 287 fills regions between adjacent conductive lines 279 and the respective cap of insulator material, if any. The top surfaces of the first insulator 283, the second insulator 285, the spacer material 287 are coplanar and define the upper boundary 276a of the metallization layer 276. In this example, the spacer material 287 extends the entire vertical height of the metallization layer 276 between the base (e.g., layer 277) and the upper boundary 276a of the metallization layer, even when the metal of the conductive line does not. An example spacer material 291 is silicon cyanate (referred to as $Si(OCN)_4$ or more generally as SiOCN). Examples of the first insulator 283 and second insulator 285 include oxides (e.g., $HfO_2$, $SiO_2$) and nitrides (e.g., TiN, $Si_3N_4$). The first insulator 283, second insulator 285, and spacer material 291 are selected to enable selective etching of these materials, as will be appreciated.

Method 200 of FIG. 5 continues with forming 210 conductive vias in contact with one or more of the conductive lines. In one embodiment, vias are formed 210 in contact with only some of the conductive lines, such as only conductive lines of the first metal, only conductive lines of the second metal, a subset of all conductive lines of the first or second metals, or a subset of conductive lines of a particular metal. Process 210 can be performed, for example, by depositing an etch mask and patterning openings in the mask corresponding to the location of vias. The cap of insulator material exposed through openings in the mask can be removed by wet or dry etch techniques while leaving the spacer material intact or substantially intact. The remaining opening left by the removed insulator material can then be filled with a metal or other conductive material, such as noted above. Optionally, cleaning the exposed metal of the exposed conductive line or other processing may be performed, followed by removal of the etch mask, as will be appreciated.

FIG. 6B illustrates a cross-sectional view of the local interconnect stack 275 of FIG. 6A after forming 210 conductive vias 289. In this example, the first insulator 283 was removed from some, but not all, of the first conductive lines 279. The vias 289 extend into the metallization layer 276 to make contact with the exposed first conductive lines 279, thereby replacing the first insulator 283 that was there previously. A portion of the vias 289 also include some metal or conductive material on top of the upper boundary 276a of the metallization layer 276, the portion corresponding to the mask opening used in process 210.

Method 200 of FIG. 5 continues with removing 215 the spacer material between adjacent conductive lines and the respective cap of insulator material on the conductive lines. Process 215 can be performed, for example, using an atomic layer etch process. For example, a fluorocarbon plasma etch has shown to be effective for high aspect ratio removal of a silicon cyanate (SiOCN) spacer material. Atomic layer etching has also shown to be selective to silicon dioxide ($SiO_2$), silicon nitride ($Si_3N_4$), hafnium oxide ($HfO_2$) and titanium nitride (TiN), compounds which may be used for the first and second insulator. As such, when the first and second insulator materials are selected from these compounds, process 215 can effectively remove the spacer material while leaving intact or substantially intact the cap of insulator material on the conductive lines.

The use of vapor phase etch for the high aspect ratio spacer material may be especially desirable due to the improved mass transport of volatile etch products compared to slower liquid diffusion for wet etch techniques. The spacer material can be selected from dielectric materials including, but not limited to, silicon dioxide, silicon nitride, aluminum nitride, aluminum oxide, gallium oxide, zinc oxide, titanium dioxide, zirconium dioxide, and hafnium dioxide. The vapor phase etch of such dielectric materials may be accomplished by heating the substrate, typically to between 150-400° C., under reduced pressure, typically 0.1 to 500 Torr, and alternatively exposing the substrate to one or more vapor phase species alternating with purge steps to remove volatile etch products. In the case of some materials, a chemical vapor etch may be employed involving the introduction of a vapor phase etchant followed by a purge to remove unused etchant and volatile etch products. For example, $TiO_2$ can be removed through vapor phase exposure to a fluorinating agent such as anhydrous hydrogen fluoride (HF). In other embodiments, two or more vapor phase reagents are used for removal of the spacer material using self-limiting surface reactions constituting an atomic layer etch (ALE) process. These processes typically involve a surface activation step which may be a chemical oxidation using oxygen ($O_2$), ozone ($O_3$), hydrogen peroxide ($H_2O_2$), or oxygen ($O_2$) plasma, or a halogenating reagent such as fluorine ($F_2$), nitrogen trifluoride ($NF_3$) plasma, xenon difluoride ($XeF_2$), germanium tetrafluoride ($GeF_4$), sulfur tetrafluoride ($SF_4$), chlorine ($Cl_2$), germanium tetrachloride ($GeCl_4$), silicon tetrachloride ($SiCl_4$), or thionyl chloride ($SOCl_2$), followed by a purge step. This activated surface layer is converted into a volatile etch species through the introduction of new ligands by a second etch reagent, which may be a halogen or an organic ligand followed by a purge step.

Examples of representative atomic layer etch (ALE) processes include but are not limited to: i) ALE of $SiO_2$ using trimethyl aluminum ($AlMe_3$) followed by a fluorinating reagent; ii) ALE of silicon nitride using oxidation (e.g., exposure to $O_2$, $O_3$, $H_2O_2$ or $O_2$ plasma), followed by $AlMe_3$ and then a fluorinating reagent; iii) ALE of gallium oxide ($Ga_2O_3$) using a fluorinating reagent followed by a chlorinating reagent such as $SnCl_4$ or $TiCl_4$; iv) ALE of zinc oxide (ZnO) using $O_2$ plasma followed by acetylacetone, or alternatively using a fluorinating reagent followed by aluminum dimethyl chloride ($AlMe_2Cl$); v) ALE aluminum oxide or "alumina" ($Al_2O_3$) using a fluorinating reagent followed by $AlMe_3$ or $AlMe_2Cl$; vi) ALE of aluminum nitride (e.g., $Al_3N_4$) using tin acetylacetonate ($Sn(acac)_2$) followed by a fluorinating reagent; vii) ALE of hafnium oxide of zirconium oxide using a fluorinating reagent followed by $TiCl_4$ or $SiCl_4$, $AlMe_3$, or $AlMe_2Cl$. These vapor phase etch processes may be chosen so as to have high selectivity to other surrounding materials such that the desired air gap between conductive lines may be formed without damaging the remaining structure.

FIG. 6C illustrates a cross-sectional view of the local interconnect stack 275 after removing 215 the spacer material 287. In this example, no masking was performed so the atomic layer etch of process 215 removed the spacer material 287 between all adjacent conductive lines while leaving intact or substantially intact the first conductive lines 279, second conductive lines 281, the first insulator material 283, the second insulator material 285, and vias 289. As can be seen in FIG. 6C, removal of the spacer material 287 resulted in corresponding voids 291 between adjacent conductive lines and the respective insulator material. In this example, voids 291 extend vertically from the device layer 277 (e.g., interlayer dielectric of device layer 277) along the entire height of the conductive lines and respective insulator material thereon. As noted above, atomic layer etch processing can selectively remove a material in areas having a high aspect ratio, such as between adjacent conductive lines. Nonetheless, in some embodiments, a relatively small residual portion of spacer material 287 may remain in the void 291 between the conductive lines.

Method 200 of FIG. 5 continues with capping or closing 220 the upper end portion of voids between adjacent conductive lines and their respective cap of insulator material. Process 220 can be performed, for example, by depositing a layer of interlayer dielectric (ILD) on the local interconnect stack 275. The ILD can be an insulator, passivation material, other suitable material. In some embodiments, the ILD material can be aluminum oxide ($Al_2O_3$), silicon nitride ($Si_3N_4$), silicon dioxide ($SiO_2$), carbon-doped silicon dioxide ($SiO_2$:C), or spin-on glass, to name a few examples. As a result of the deposition technique (e.g., spin coating or blanket deposition) and the aspect ratio of the voids between conductive lines, the ILD generally forms a layer of material in contact with the top surface of the first and second insulating materials, thereby closing the top of the voids. In some embodiments, the ILD has relatively little or no penetration down into the void. In other embodiments, the ILD may extend slightly into some or all of the voids. Process 220 optionally includes recessing or planarizing the ILD to be coplanar with the top surface of the vias 289, such as by chemical mechanical polishing (CMP).

FIG. 6D illustrates a cross-sectional view of a local interconnect stack 275 after closing 220 the upper end portion 291a of voids 291 with a layer of ILD 293 deposited on top of the metallization layer 276. As illustrated in this example, the ILD 293 has been polished to be coplanar with the top surface of the vias 289. The ILD 293 is illustrated as sagging slightly into the upper end portion 291a of each void 291. Having completed process 220, the local interconnect stack 275 has closed the voids 291 between adjacent conductive lines 279, 281.

Referring now to FIG. 7, a flow chart illustrates processes in a method 300 of fabricating an interconnect structure for an integrated circuit, in accordance with other embodiments of the present disclosure. As discussed below, method 300 may include an optional masking process, in accordance with some embodiments. FIGS. 8A-8H illustrate cross-sectional views of example interconnect structures at various stages of processing and will be discussed along with method 300 of FIG. 7. FIGS. 8A-8H show example structures of two embodiments of method 300, one which includes and one which omits the masking process.

Method 300 of FIG. 7 begins with providing 305 a local interconnect stack with a plurality of conductive lines extending vertically, where the conductive lines are spaced by spacer material between the conductive lines. Similar to process 205 discussed above, the conductive lines can have a pitch P of 40 nm or less, including 30 nm or less, 25 nm or less, 20 nm or less, 15 nm or less, and 10 nm or less. The lateral distance D between adjacent conductive lines can be 30 nm or less, including 20 nm or less, 15 nm or less, 10 nm or less, and 5 nm or less, in accordance with some embodiments. On top of each conductive line is an insulator material (e.g., a "cap"), where the cap of insulator material fills any unfilled vertical distance above the conductive line to the upper boundary of the metallization layer. In some embodiments, the conductive lines include one or more conductive lines of a first metal and one or more conductive lines of a second metal. The first metal can be capped with a first insulator material that is different from the spacer material. The second metal can be capped with a second insulator material that is different from the first insulator material and different from the spacer material. In some such embodiments, the conductive lines may have an alternating or semi-alternating arrangement. Conductive lines of the first metal can have the same or a different vertical height compared to conductive lines of the second metal. Also, conductive lines of a given metal can have the same or different vertical height. Examples of some acceptable metals for conductive lines and/or vias include aluminum, silver, gold, copper, tungsten, cobalt, ruthenium, and alloys thereof. Numerous variations and embodiments will be apparent in light of the present disclosure.

FIG. 8A illustrates a cross-sectional view of an example local interconnect stack 275 in a metallization layer 276 on a base (e.g., device layer 277) of an integrated circuit. The local interconnect stack 275 includes first conductive lines 279 of a first metal and having a first vertical height H1. The local interconnect stack 275 also includes second conductive lines 281 of a second metal and having second vertical height H2. The first conductive lines 279 are capped with a first insulator 283 and the second conductive lines 281 are capped with a second insulator 285. A spacer material 287 fills regions between adjacent conductive lines 279 and the respective cap of insulator material, if any. In this example, the spacer material 291 extends the entire vertical distance to the upper boundary 276a of the metallization layer 276 even when the metal of the conductive line does not. Examples of spacer material 291 and the first and second insulator materials discussed above for method 200 also can be used in method 300.

Method 300 of FIG. 7 optionally continues with depositing 310 a mask material over some portions of the local interconnect stack. In one embodiment, the mask material is photo resist or carbon hardmask and is deposited where the spacer material 287 is to remain. The mask material is patterned using suitable processes, such as photolithography. The mask material can be applied using any suitable process, including a spin-on process, chemical vapor deposition (CVD), physical vapor deposition (PVD), and plasma enhanced chemical vapor deposition (PECVD) to name a few examples. The use of a mask material can be advantageous it is desired to form vias in regions without voids. For example, when the first conductive line 279 has a relatively small vertical height, it may be more difficult to deposit a conductive via 289 in contact with the first conductive line 279 when spacer material 287 along the first conductive line 279 has already been removed. Thus, to avoid an electrical short to an adjacent conductive line or filling the void 291 with metal, a mask may be used in some circumstances.

FIG. 8B illustrates a cross-sectional view of the local interconnect stack 275 after depositing 305 and patterning a mask material 360. The mask material 305 is used to protect the spacer material 287 below it from subsequent etch processing, such as discussed below for process 315. Conductive vias subsequently can be processed in the location of the mask material 305 as discussed below.

Method 300 of FIG. 7 continues with removing 315 the spacer material between adjacent conductive lines. Process 315 can be performed, for example, using an atomic layer etch process, which is discussed above for process 215 of method 200. Process 315 can be performed with an atomic layer etch process regardless of whether the mask material 360 is applied, although some parameters of the etch process may be adjusted depending on the material selected for the mask material 360, as will be appreciated. After removing the spacer material, process 315 may include removing the masking material 360 (when present) in preparation for subsequent processing.

FIGS. 8C and 8D illustrate cross-sectional views of the local interconnect stack 275 after removing 315 the spacer material. FIG. 8C is an example of process 315 performed without the use of a mask material 360. Since no masking was performed in this example, the spacer material 287 between all adjacent conductive lines has been removed while leaving intact or substantially intact the first conductive lines 279, second conductive lines 281, the first insulator material 283, and the second insulator material 285. Also, since first and second conductive lines 279, 281 are arranged in an alternating pattern in this example, a void 291 in each instance is present between a first conductive line 279 and a second conductive line 281. At this stage of processing, each void 291 extends vertically along the entire height of the conductive lines and the respective insulator material thereon. In other words, voids 291 extend the entire vertical height of the metallization layer 276. As noted above, a relatively small residual portion of spacer material 287 may remain in the void 291 between the conductive lines in some embodiments.

FIG. 8D is an example of local interconnect stack 275 after removing the spacer material 287 in the presence of a mask material 360. In unmasked regions at the right and left of the structure of this example, the spacer material 287 was not covered by the mask material 360 and therefore has been removed to result in a void 291 between adjacent conductive lines in these locations. On the right and left sides of this example structure, a void 291 is present between a first conductive line 279 topped with a first insulator 283 and a second conductive line 281 topped with a second insulator 285, but such an arrangement is not required. Spacer material 287 has not been removed in the middle region of the structure that was protected by the mask material 360 as shown in FIG. 8D.

Method 300 of FIG. 7 continues with closing 320 the upper end portion of the void(s). If not already performed in process 315, process 320 may include removal of the mask material 360 (if present). In one embodiment, closing 320 the voids can be performed by PVD or CVD deposition of a low-k dielectric film. In some embodiments, the dielectric film is a metal oxide, such as a carbon-doped silicon oxide (CDO) or organosilicate glass (OSG). Other deposition methods and materials are acceptable, as will be appreciated. As deposited, the low-k dielectric film is a layer of material on top of the local interconnect stack 275 and fills the upper end portion 291a of each void 291. After deposition, the low-k dielectric film is polished or otherwise recessed to be coplanar with the tops of the first and second insulating materials, leaving the dielectric film as a plug or cap that closes each void 291.

FIGS. 8E and 8F illustrate cross-sectional views of the local interconnect stack 275 after depositing a low-k dielectric film 365 to close the voids 291, followed by planarization with chemical mechanical polishing. In each of FIGS. 8E and 8F, the dielectric film 365 occupies the upper end portion 291a of voids 291 (seen at the right and left sides of the structure in FIG. 8F). Voids 291 are encapsulated between the device layer 277 on the bottom, the dielectric film 365 on the top, and the conductive lines 279, 281 topped with the respective insulator material on each side.

Method 300 of FIG. 7 continues with processing 325 the next layer vias for some or all of the conductive lines. Process 325 can be performed, for example, by depositing an etch mask and patterning openings in the mask at locations corresponding to the desired conductive lines where vias will make contact. Since the dielectric film of process 320 is not present over the top of the first and second insulators 283, 285, selective etch processing can be used to remove the first and/or second insulator materials 283, 285 while leaving the dielectric film intact in the upper end portion 291a of voids 291. For example, the cap of insulator material exposed through openings in the mask can be removed by wet or dry etch techniques while leaving intact the dielectric film in the upper end portion 291a of the voids 291. The remaining void left by the removed insulator material can then be filled with a metal or other conductive material, such as noted above. Optionally, cleaning the exposed metal of the exposed conductive line or other processing may be performed, followed by removal of the etch mask, as will be appreciated.

FIGS. 8G and 8H illustrate cross-sectional views of the local interconnect stack 275 after processing 325 the next layer vias 289. In FIG. 8G, vias 289 make contact with the second conductive lines 281, which have a vertical height that extends at least to the bottom of the dielectric film 365, in accordance with some embodiments. As a result, removing the second insulator 285 on top of the second conductive lines 281 does not open the voids 291 adjacent the second conductive line 281 for metal deposition of the vias 289. Therefore, processing the vias 289 can avoid an electrical short to adjacent conductive lines and can avoid introducing metal into the voids 291, as will be appreciated.

In FIG. 8H, the vias 289 make electrical contact with the first conductive lines 279, which have a smaller vertical height and which do not extend to the level of the dielectric film 365. By retaining the spacer material 287 adjacent the first conductive lines 279 that will receive vias 289, process 325 can be performed without an electrical short with an adjacent conductive line, as will be appreciated. As also shown in FIG. 8H, a void 291 is encapsulated below the dielectric film 365 at the right and left sides of this example structure. Here, each void 291 is between a first conductive line 279 with first insulator 283 and a second conductive line 281 with second insulator 285. Numerous variations and embodiments will be apparent in light of the present disclosure.

Referring now to FIG. 9, a flow chart illustrates processes in a method 400 of fabricating an interconnect structure for an integrated circuit, in accordance with other embodiments. Method 400 of FIG. 9 begins with providing 405 a local interconnect stack with a plurality of conductive lines extending vertically, where the conductive lines are spaced by spacer material between the conductive lines. As with some embodiments discussed above, the conductive lines can have a pitch P of 40 nm or less, including 30 nm or less, 25 nm or less, 20 nm or less, 15 nm or less, and 10 nm or less. The lateral distance D between adjacent conductive lines can be 30 nm or less, including 20 nm or less, 15 nm or less, 10 nm or less, and 5 nm or less, in accordance with some embodiments. On top of each conductive line is an insulator material (e.g., a "cap"), where the cap of insulator material fills any unfilled vertical distance above the conductive line to the upper boundary of the metallization layer. In some embodiments, the conductive lines include one or more conductive lines of a first metal and one or more conductive lines of a second metal. The first metal can be capped with a first insulator material that is different from the spacer material. The second metal can be capped with a second insulator material that is different from the first insulator material and different from the spacer material. In some such embodiments, the conductive lines may have an alternating or semi-alternating arrangement. Conductive lines of the first metal can have the same or a different vertical height compared to conductive lines of the second metal. Also, conductive lines of a given metal can have the same or different vertical height. Examples of some acceptable metals for conductive lines and/or vias include aluminum, silver, gold, copper, tungsten, cobalt, ruthenium, and alloys thereof. Numerous variations and embodiments will be apparent in light of the present disclosure.

Figure 10A:
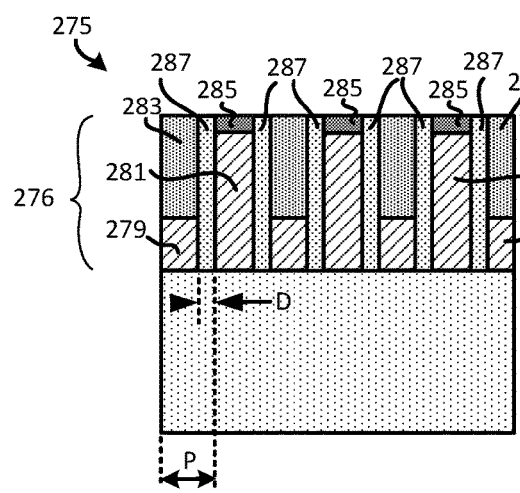
FIGS. 10A-10G illustrate cross-sectional views of interconnect structures at various stages of processing according the method of FIG. 9, in accordance with some embodiments of the present disclosure.

FIG. 10A illustrates a cross-sectional view of an example local interconnect stack 275 in a metallization layer 276 on a device layer 277 of an integrated circuit. The local interconnect stack 275 includes first conductive lines 279 of a first metal and first vertical height H1 and second conductive lines 281 of a second metal and second vertical height H2. The first conductive lines 279 are capped with a first insulator 283 and the second conductive lines 281 are capped with a second insulator 285. The first and second insulators 283, 285 extend from the top surface of the respective conductive line to the upper boundary 276a of the metallization layer 276. A spacer material 287 fills the region between adjacent conductive lines 279 and the respective cap of insulator material, if any. In this example, the spacer material 291 extends the entire vertical distance of the metallization layer 276 even when the metal of the conductive line does not. Examples of spacer material 291 and the first and second insulator materials discussed above for method 200 also can be used in method 400.

Method 400 of FIG. 9 continues with selective regrowth of 410 the second insulator 285 material on the existing second insulator 285 in the local interconnect stack 275. Process 410 increases the vertical height of the second insulator 285 above the upper boundary of the metallization layer. Selective regrowth 410 can be performed using any suitable method, such as vapor deposition and epitaxial growth, as will be appreciated. Following regrowth 410 of the second insulator 285, a second spacer material 288 different from the first spacer material 287 is deposited on the local interconnect stack 275 and etched to result in the second spacer material 288 on top of the first spacer material 287 and extending up from the first spacer material 287 along opposite sides of the extended second insulator 285. For example, the second spacer material 288 can be deposited using blanket deposition techniques. Masking and etch processing can be used to pattern the second spacer material 288 into sidewalls along the second insulator material 285. In one embodiment, the first spacer material is SiOCN and the second spacer material is $SiO_2$, SiN, $HfO_2$, or TiN. As noted above, it has been determined that atomic layer etching of SiOCN is selective to $SiO_2$, SiN, $HfO_2$, and TiN using a fluorocarbon plasma etch process.

Figure 10B:
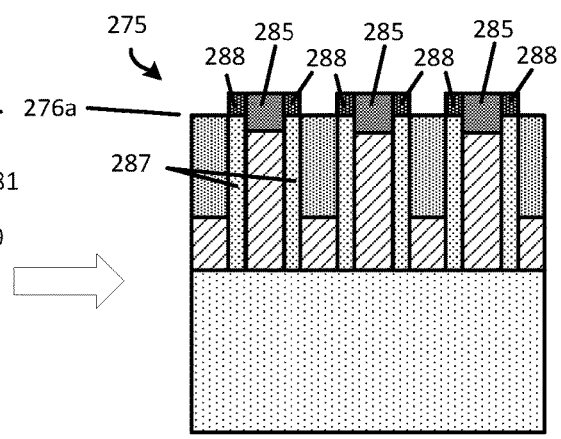

FIG. 10B illustrates a cross-sectional view of the local interconnect stack 275 after selective regrowth 410 of the first insulator 293 and deposition of the second spacer material 288 along the sides of the first insulator 293 material. As can be seen in FIG. 10B, the first insulator 293 and spacer material 287 now extend vertically above the upper boundary 276a of the metallization layer 276.

Figure 10C:
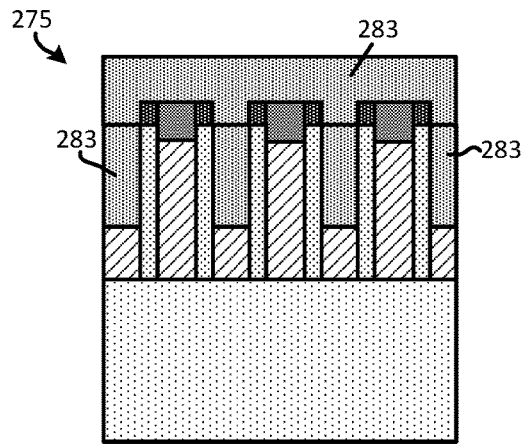
Figure 10D:
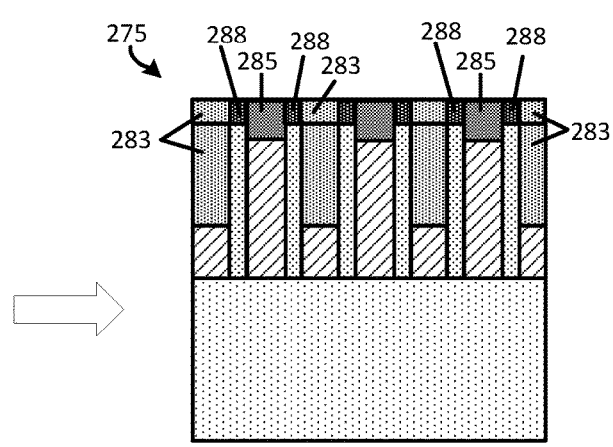

Method 400 of FIG. 9 continues with re-deposition 415 of the first insulator on top of the structure, such as using blanket deposition techniques. The structure can then be planarized 417 as needed using chemical mechanical polishing or other suitable technique so that tops of the first insulator, second insulator, and second spacer material are coplanar. FIGS. 10C and 10D illustrate cross-sectional views of the local interconnect stack 275 after depositing the first insulator 283 and then planarizing the structure.

Method 400 of FIG. 9 continues with removing 420 the second insulator, followed by removing 422 the first spacer material between the conductive lines. In one embodiment, atomic layer etching is used to selectively remove the second insulator, and then selectively remove the first spacer material between the conductive lines. As discussed above for process 215 of method 200, atomic layer etching has been shown to be selective between various materials and effective to remove materials in geometries with a high aspect ratio. The first insulator, second insulator, first spacer material and second spacer material can be selected to result in removal of the desired material using a vapor phase etch, as will be appreciated.

Figure 10E:
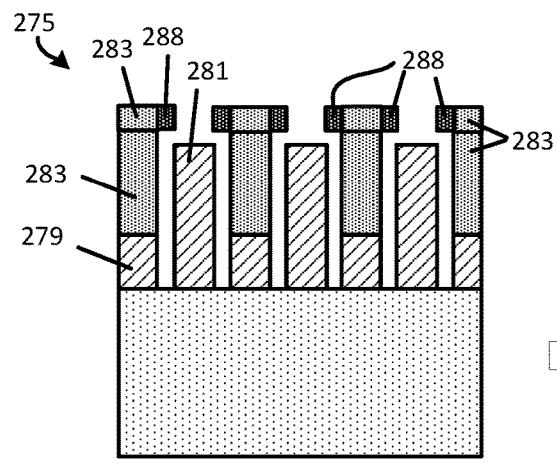

FIG. 10E illustrates a cross-sectional view of the local interconnect stack 275 after removing the second insulator 285 and (first) spacer material 287 to result in voids 291 between the conductive lines. As can be seen in this example, lobes of the second spacer material 288 extend laterally from the first insulator material 283 on the first conductive lines 279. As a result of the added first insulator 283, the lobes of second spacer material 288 are vertically spaced above the top of the second conductive lines 281, which provides sufficient space for vapor-phase etchants to reach and remove the spacer material 287 between the first and second conductive lines 279, 281. The lobes of second spacer material 288 also can function as a mask to prevent deposition of second insulator 285 in the voids 291 in subsequent processing.

Method 400 of FIG. 9 continues with closing 425 the voids. In one embodiment, process 425 can be performed by deposition of the second insulator material onto the second conductive lines 281. For example, the second insulator is deposited through gaps between lobes of the second spacer material to land on the top of the second conductive lines 281. The structure optionally is planarized as needed.

Figure 10F:
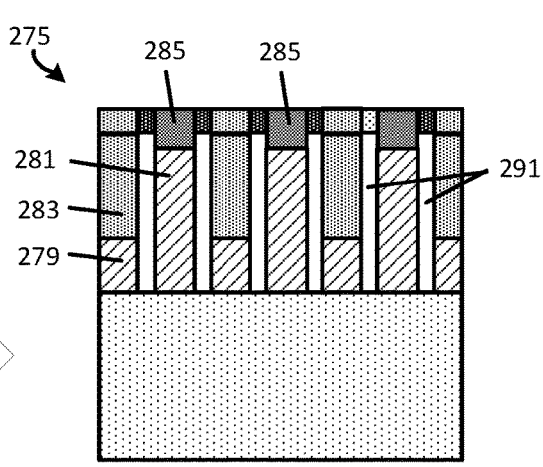

FIG. 10F illustrates a cross-sectional view of the local interconnect stack 275 after closing the voids 291. In this example, the second insulator 285 was deposited using a vapor deposition technique. The second insulator 285 landed on the second conductive lines 281 and on the exposed top surfaces of the first insulator 283 and second spacer material 288. The structure was planarized to remove the second insulator 285 from the first insulator 283 and second spacer material 288.

Method 400 of FIG. 9 continues with processing 430 the next layer vias for some or all of the conductive lines. In one embodiment, process 430 can be performed with selective etch processing to remove the first and/or second insulator materials 283, 285 while leaving the second spacer 288 intact. In one embodiment, an anisotropic etch is used to define the via openings in locations corresponding to the conductive lines. The remaining void left by the removed insulator material can then be filled with a metal or other conductive material to form conductive vias 289 in contact with conductive line(s). In one embodiment, the conductive via is deposited using atomic layer deposition (ALD). The conductive vias can be made from a wide range of metals, alloys, or other conductive materials, such as polysilicon, aluminum (Al), tungsten (W), titanium (Ti), tantalum (Ta), copper (Cu), titanium nitride (TiN), or tantalum nitride (TaN), for example.

Figure 10G:
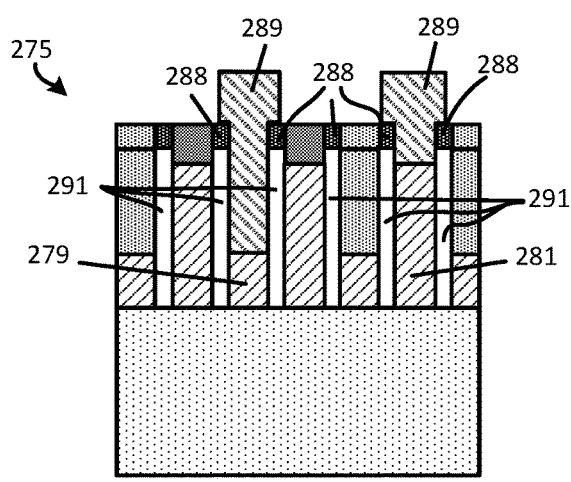

FIG. 10G illustrates cross-sectional views of the local interconnect stack 275 after processing 430 the next layer vias 289. In FIG. 10G, vias 289 make contact with one of the second conductive lines 281 and with one of the first conductive lines 279. In these locations the vias 289 also contact the sides and top of the second spacer material 288, thereby closing the voids 291 adjacent each via 289. After removing the first insulator 283 on one of the first conductive lines 279, a via extends through the resulting opening between second spacer material 288 to contact the first conductive line 279. Similarly, after removing the second insulator 285 on one of the second conductive lines 281, a via 289 extends the resulting opening between second spacer material 288 to contact the second conductive line 279.

Note that the processes in methods 200, 300, and 400 are shown in a particular order for ease of description. However, one or more of the processes may be performed in a different order or may not be performed at all (and thus be optional), in accordance with some embodiments. Processes described above are not exhaustive and some processes may include additional processing, such as lithography, deposition of isolation layers, and other such processes, as will be appreciated.

Example System

Figure 11:
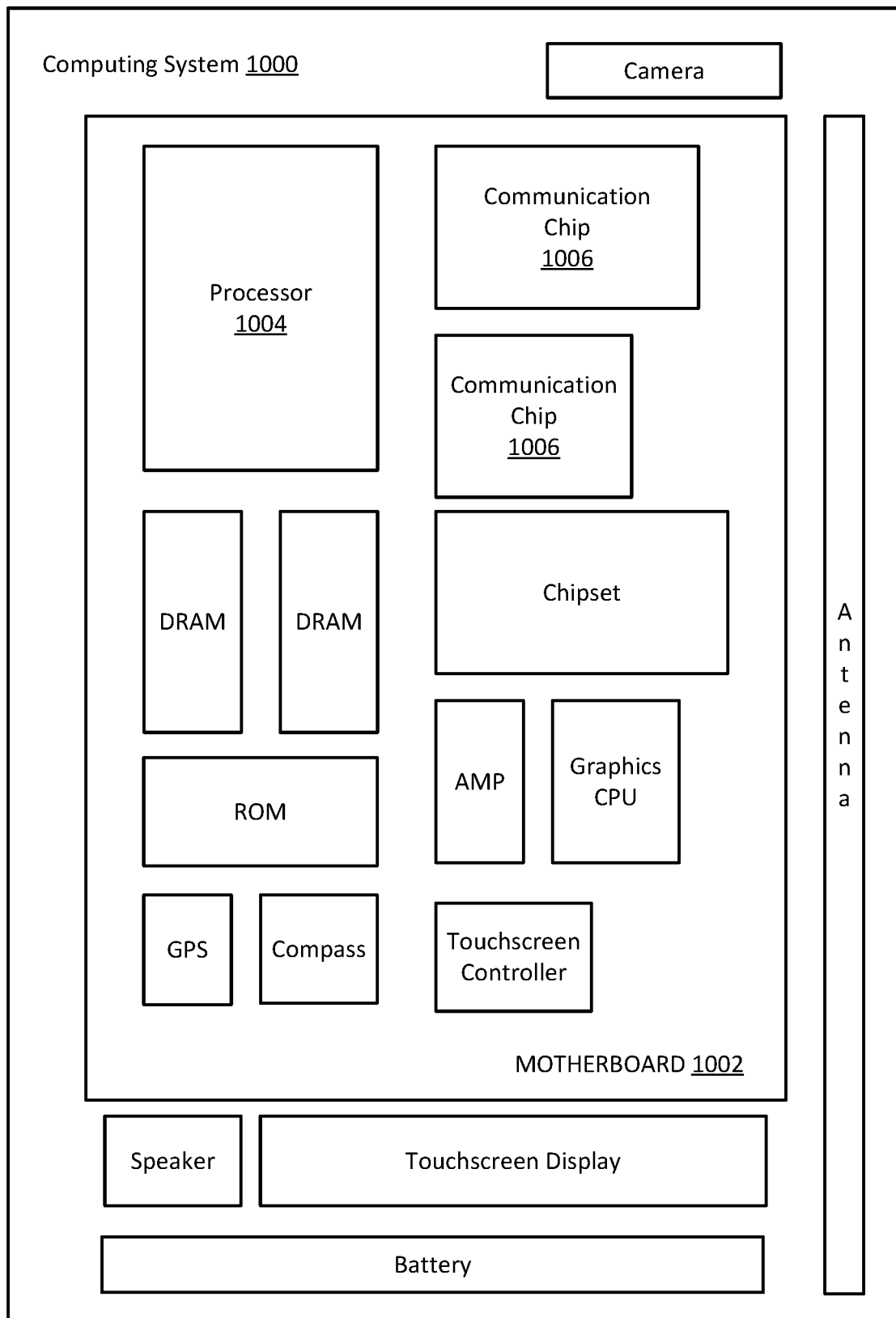
FIG. 11 illustrates an example computing system with an integrated circuit implementing interconnect structures disclosed herein, in accordance with an embodiment of the present disclosure.

FIG. 11 illustrates a computing system 1000 implemented with the interconnects structures or techniques disclosed herein, according to an embodiment of the present disclosure. As can be seen, the computing system 1000 houses a motherboard 1002. The motherboard 1002 may include a number of components, including, but not limited to, a processor 1004 (including embedded memory, such as an eDRAM incorporating recessed thin-channel TFTs as described herein) and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, to name a few examples.

Depending on its applications, computing system 1000 may include one or more other components that may or may not be physically and electrically coupled to the motherboard 1002. These other components may include, but are not limited to, volatile memory (e.g., dynamic random access memory (DRAM) or embedded dynamic random access memory (eDRAM)), nonvolatile memory (e.g., read-only memory (ROM), resistive random-access memory (RRAM), and the like), a graphics processor, a digital signal processor, a crypto (or cryptographic) processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures that includes an interconnect structure formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, and the like that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more interconnect structures or devices (e.g., one or more memory cells) formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more interconnect structure formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more interconnect structures or integrated circuits formed using the disclosed techniques, as variously described herein.

Further Example Embodiments

The following examples pertain to further embodiments, from which numerous permutations and configurations will be apparent.

Example 1 is an integrated circuit comprising a base comprising an insulating dielectric; a plurality of conductive lines extending vertically above the base in a spaced-apart arrangement, the plurality including a first conductive line and a second conductive line adjacent to the first conductive line; a void located laterally between the first and second conductive lines; and a cap of insulating material located above the void and defining an upper boundary of the void, such that the void is further located between the base and the cap of insulating material.

Example 2 includes the subject matter of Example 1 and further comprises an insulator in contact with a top of at least one of the plurality of conductive lines, the insulator in contact with the cap of insulating material above the void.

Example 3 includes the subject matter of 1 and further comprises a first insulator on the first conductive line and a second insulator on the second conductive line, where the second insulator compositionally distinct from the first insulator. The cap of insulating material contacts and extends between the first insulator and the second insulator.

Example 4 includes the subject matter of any of Examples 1-3, wherein the first conductive line comprises a first metal and the second conductive line comprises a second metal different from the first metal.

Example 5 includes the subject matter of any of Examples 1-4 and further comprises a conductive via in contact with a top of at least one of the plurality of conductive lines, the conductive via extending vertically above the cap of insulating material.

Example 6 includes the subject matter of any of Examples 1-5, wherein the base further includes a first contact and a second contact with the insulating dielectric, wherein the first conductive line contacts the first contact, the second conductive line contacts the second contact, and a lower boundary of the void is defined by the insulating dielectric of the base.

Example 7 includes the subject matter of Example 6, wherein the first contact is a source region contact, and the second contact is a drain region contact.

Example 8 includes the subject matter of Example 6, wherein one of the first contact or the second contact is a gate contact.

Example 9 includes the subject matter of any of Examples 1-8, wherein the plurality of conductive lines includes at least five conductive lines, wherein each pair of adjacent lines of the at least five conductive lines defines a void therebetween.

Example 10 is an integrated circuit comprising a layer of insulating dielectric; a first conductive line extending vertically above the layer of insulating dielectric; a second conductive line adjacent the first conductive line and extending vertically above the layer of insulating dielectric, the second conductive line spaced from the first conductive line by a void between the first conductive line and the second conductive line; and a cap of insulating material defining an upper boundary of the void, the cap positioned laterally between the first conductive line and the second conductive line; wherein the void is positioned laterally between the first conductive line and the second conductive line, and the void is positioned vertically between the cap of insulating material and the layer of insulating dielectric.

Example 11 includes the subject matter of Example 10 and further comprises a first insulating material in contact with and extending up from an upper end of the first conductive line; and a second insulating material in contact with and extending up from an upper end of the second conductive line; wherein the cap of insulating material extends laterally between and contacts the first insulating material and the second insulating material.

Example 12 includes the subject matter of Example 10 or 11, wherein the first conductive line comprises a first metal and the second conductive line comprises a second metal compositionally distinct from the first metal.

Example 13 includes the subject matter of Example 12, wherein the first insulating material is compositionally distinct from the second insulating material.

Example 14 includes the subject matter of any of Examples 11-13, wherein top surfaces of the first insulating material, the second insulating material, and the cap of insulating material are coplanar.

Example 15 includes the subject matter of any of Examples 11-14, wherein the void extends vertically between at least a portion of the first insulating material and at least a portion of the second insulating material, and wherein the cap of insulating material extends laterally between the first insulating material and the second insulating material.

Example 16 includes the subject matter of any of Examples 10 and further comprises a third conductive line extending vertically above the insulating dielectric and spaced from the second conductive line by a second void and a conductive via in contact with an upper end of the third conductive line.

Example 17 includes the subject matter of any of Examples 10-16, wherein a first vertical height of the first conductive line is different from a second vertical height of the second conductive line.

Example 18 includes the subject matter of any of Examples 10-17, wherein the first conductive line is spaced laterally from the second conductive line by no more than 30 nm.

Example 19 includes the subject matter of Example 18, wherein the first conductive line is spaced laterally from the second conductive line by no more than 20 nm.

Example 20 includes the subject matter of Example 18, wherein the first conductive line is spaced laterally from the second conductive line by no more than 15 nm.

Example 21 includes the subject matter of Example 18, wherein the first conductive line is spaced laterally from the second conductive line by no more than 10 nm.

Example 22 includes the subject matter of Example 10 and further comprises a conductive via in contact with at least one of an upper end of the first conductive line and an upper end of the second conductive line, wherein a portion of the void extends along part of the conductive via.

Example 23 includes the subject matter of any of Examples 10-22, wherein the first conductive line and the second conductive line are part of a first metallization layer of an integrated circuit.

Example 24 includes the subject matter of Example 10 and further comprises one or more semiconductor devices below the interconnect structure, wherein the first conductive line and the second conductive line are electrically coupled the one or more semiconductor devices.

Example 25 is a method of fabricating a local interconnect structure, the method comprising providing a local interconnect stack that includes a plurality of conductive lines extending vertically above a base in a spaced-apart arrangement, the conductive lines spaced laterally by a spacer material therebetween; removing the spacer material to define a void between adjacent lines of the plurality of conductive lines; forming a conductive via in contact with a top of at least one of the plurality of conductive lines; and closing a top of each void between adjacent lines with an insulating dielectric material.

Example 25 includes the subject matter of Example 24, wherein removing the spacer is performed with an atomic layer etch.

Example 26 includes the subject matter of Example 24 or 25 and further comprises masking the spacer material between some of the plurality of conductive lines prior to removing the spacer material, wherein forming the conductive via is performed for at least one of the conductive lines adjacent the spacer material.

Example 27 includes the subject matter of any of Examples 1-24, wherein the integrated circuit includes a memory structure.

Example 28 includes the subject matter of Example 27, wherein the memory structure is a vertical memory structure.

Example 29 is a computing system comprising the integrated circuit of any of Examples 1-24 or 27-28.

Example 30 includes the subject matter of Example 29 and further comprises a touch screen display.

Example 31 includes the subject matter of Examples 29 or 30 and further comprises a processor.

Example 32 includes the subject matter of any of Examples 29-31 and further comprises a communication chip.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit, comprising:
  a base comprising an insulating dielectric;
  a plurality of conductive lines extending vertically above the base in a spaced-apart arrangement, the plurality including a first conductive line and a second conductive line adjacent to the first conductive line, wherein the first conductive line has a bottommost surface at a same level as a bottommost surface of the second conductive line, and wherein the first conductive line has an uppermost surface above an uppermost surface of the second conductive line;
a void located laterally between the first and second conductive lines; and
a cap of insulating material located above the void and defining an upper boundary of the void, such that the void is further located between the base and the cap of insulating material.

2. The integrated circuit of claim 1 further comprising:
an insulator in contact with a top of at least one of the plurality of conductive lines, the insulator in contact with the cap of insulating material above the void.

3. The integrated circuit of claim 1 further comprising:
a first insulator on the first conductive line; and
a second insulator on the second conductive line, the second insulator compositionally distinct from the first insulator;
wherein the cap of insulating material contacts and extends between the first insulator and the second insulator.

4. The integrated circuit of claim 3, wherein the first conductive line comprises a first metal and the second conductive line comprises a second metal compositionally different from the first metal.

5. The integrated circuit of claim 1 further comprising:
a conductive via in contact with a top of at least one of the plurality of conductive lines, the conductive via extending vertically above the cap of insulating material.

6. The integrated circuit of claim 1, wherein the base further includes a first contact and a second contact within the insulating dielectric, wherein the first conductive line contacts the first contact, the second conductive line contacts the second contact, and a lower boundary of the void is defined by the insulating dielectric of the base.

7. The integrated circuit of claim 6, wherein the first contact is a source region contact, and the second contact is a drain region contact.

8. The integrated circuit of claim 6, wherein one of the first contact or the second contact is a gate contact.

9. The integrated circuit of claim 1, wherein the plurality of conductive lines includes at least five conductive lines, wherein each pair of adjacent lines of the at least five conductive lines defines a void therebetween.

10. An integrated circuit comprising:
a layer including insulating dielectric;
a first conductive line extending vertically above the layer;
a second conductive line adjacent to the first conductive line and extending vertically above the layer, the second conductive line spaced from the first conductive line by a void between the first conductive line and the second conductive line, wherein the second conductive line has a bottommost surface at a same level as a bottommost surface of the first conductive line, and wherein the first conductive line has an uppermost surface above an uppermost surface of the second conductive line; and
a cap of insulating material defining an upper boundary of the void, the cap is at least partially laterally adjacent to one or both of the first conductive line and the second conductive line; wherein the void is laterally between the first conductive line and the second conductive line, and the void is vertically between the cap of insulating material and the layer.

11. The integrated circuit of claim 10 further comprising:
a first insulating material in contact with and extending up from an upper end of the first conductive line; and
a second insulating material in contact with and extending up from an upper end of the second conductive line;
wherein the cap of insulating material is at least in part laterally between and contacts the first insulating material and the second insulating material; and
wherein top surfaces of the first insulating material, the second insulating material, and the cap of insulating material are coplanar.

12. The integrated circuit of claim 11, wherein the first conductive line comprises a first metal and the second conductive line comprises a second metal compositionally distinct from the first metal, and wherein the first insulating material is compositionally distinct from the second insulating material.

13. The integrated circuit of claim 11, wherein the void extends vertically between at least a portion of the first insulating material and at least a portion of the second insulating material, and wherein the cap of insulating material extends laterally between at least a portion of the first insulating material and at least a portion of the second insulating material.

14. The integrated circuit of claim 10, wherein the void is a first void, the integrated circuit further comprising:
a third conductive line extending vertically above the insulating dielectric and spaced from the second conductive line by a second void; and
a conductive via in contact with an upper end of the third conductive line.

15. The integrated circuit of claim 10, wherein the first conductive line is spaced laterally from the second conductive line by no more than 30 nm.

16. The integrated circuit of claim 10 further comprising a conductive via in contact with at least one of an upper end of the first conductive line and an upper end of the second conductive line, wherein a portion of the void extends along part of the conductive via.

17. An integrated circuit comprising:
a device layer including one or more transistors; and
an interconnect structure above the device layer and including a first interconnect line extending vertically above the device layer and comprising a first conductive material, a second interconnect line adjacent to the first interconnect line and extending vertically above the device layer, the second interconnect line comprising a second conductive material compositionally different from the first conductive material, a void extending vertically above the device layer and between the first and second interconnect lines, such that first and second sidewalls of the void are at least partially defined by corresponding sidewalls of the first and second interconnect lines, a first insulator material at least partially defining an upper boundary of the void, a via structure in contact with a top surface of the first interconnect line, and also in contact with the first insulator material, and a second insulator material in contact with a top surface of the second interconnect line, and also in contact with the first insulator material, the second insulator structure compositionally different from the first insulator structure.

18. The integrated circuit of claim of claim 17, wherein the first insulator material completely defines the upper boundary of the void.

19. The integrated circuit of claim 17, wherein the upper boundary of the void is defined partly by the first insulator material and partly by the via structure.

20. An integrated circuit, comprising:
- a base comprising an insulating dielectric;
- a plurality of conductive lines extending vertically above the base in a spaced-apart arrangement, the plurality including a first conductive line and a second conductive line adjacent to the first conductive line, wherein the first conductive line comprises a first metal and the second conductive line comprises a second metal compositionally different from the first metal;
- a void located laterally between the first and second conductive lines; and a cap of insulating material located above the void and defining an upper boundary of the void, such that the void is further located between the base and the cap of insulating material.

\* \* \* \* \*